United States Patent
Lee

(10) Patent No.: US 10,622,076 B2
(45) Date of Patent: Apr. 14, 2020

(54) MEMORY SYSTEM AND OPERATION METHOD THEREOF

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/037,588

(22) Filed: Jul. 17, 2018

(65) Prior Publication Data

US 2019/0198119 A1    Jun. 27, 2019

(30) Foreign Application Priority Data

Dec. 21, 2017    (KR) .................. 10-2017-0177236

(51) Int. Cl.
| | | |
|---|---|---|
| G11C 16/26 | (2006.01) | |
| G11C 16/08 | (2006.01) | |
| G11C 16/34 | (2006.01) | |
| G11C 29/42 | (2006.01) | |
| G11C 29/44 | (2006.01) | |
| G11C 29/50 | (2006.01) | |
| G11C 29/04 | (2006.01) | |

(52) U.S. Cl.
CPC .............. *G11C 16/26* (2013.01); *G11C 16/08* (2013.01); *G11C 16/3422* (2013.01); *G11C 29/42* (2013.01); *G11C 29/44* (2013.01); *G11C 29/50* (2013.01); *G11C 29/50012* (2013.01); G11C 2029/0409 (2013.01)

(58) Field of Classification Search
CPC ..... G11C 16/26; G11C 16/08; G11C 16/3422; G11C 29/42; G11C 29/44; G11C 29/50
See application file for complete search history.

(56) References Cited

U.S. PATENT DOCUMENTS

| | | | | |
|---|---|---|---|---|
| 7,675,776 B2* | 3/2010 | Allen | ...................... | G11C 29/76 365/185.09 |
| 8,095,765 B2* | 1/2012 | Asnaashari | ......... | G06F 12/0246 711/170 |
| 2010/0228940 A1* | 9/2010 | Asnaashari | ......... | G06F 12/0246 711/170 |
| 2016/0179596 A1* | 6/2016 | Kim | ...................... | G06F 11/076 714/704 |

FOREIGN PATENT DOCUMENTS

| | | |
|---|---|---|
| KR | 101626528 | 6/2016 |
| KR | 1020160071948 | 6/2016 |

* cited by examiner

*Primary Examiner* — Tri M Hoang
(74) *Attorney, Agent, or Firm* — IP & T Group LLP

(57) ABSTRACT

A memory system includes: a memory device including a plurality of memory blocks; a bad memory block detection unit suitable for performing a test read operation on the plurality of memory blocks to detect a bad memory block; and a controller suitable for controlling the memory device to perform a read reclaim operation to the bad memory block according to a result of detecting the bad memory block by the bad memory block detection unit.

20 Claims, 15 Drawing Sheets

FIG. 6A

| Memory Block | recently read or not |
|---|---|
| 1st Memory Block | 1 |
| 2nd Memory Block | 0 |
| 3rd Memory Block | 1 |
| 4th Memory Block | 0 |

Test Read Table

FIG. 6B

| SUPER Memory Block | recently read or not |
|---|---|
| 1st SUPER Memory Block | 1 |
| 2nd SUPER Memory Block | 0 |
| 3rd SUPER Memory Block | 0 |
| 4th SUPER Memory Block | 1 |

Test Read Table

MEMORY SYSTEM AND OPERATION METHOD THEREOF

CROSS-REFERENCE TO RELATED APPLICATIONS

The present application claims priority under 35 U.S.C. § 119(a) to Korean Patent Application No. 10-2017-0177236, filed on Dec. 21, 2017, the disclosure of which is incorporated herein by reference in its entirety.

BACKGROUND

1. Field

Various exemplary embodiments of the invention generally relate to an electronic device. Particularly, the embodiments relate to a memory system capable of detecting efficiently a bad block for performing a read reclaim operation and an operating method thereof.

2. Description of the Related Art

The computer environment paradigm has moved to ubiquitous computing systems that can be used anytime and anywhere. The use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems may provide excellent stability, durability, high information access speed, and low power consumption because they have no moving parts (e.g., a mechanical arm with a read/write head) as compared with a hard disk device. Examples of memory systems having such advantages include universal serial bus (USB) memory devices, memory cards having various interfaces, and solid state drives (SSD).

SUMMARY

Various embodiments are directed to a memory system capable of detecting a bad block for performing a read reclaim operation and an operating method thereof.

In accordance with an embodiment of the present invention, a memory system may include: a memory device including a plurality of memory blocks; a bad memory block detection unit suitable for performing a test read operation on the plurality of memory blocks to detect a bad memory block; and a controller suitable for controlling the memory device to perform a read reclaim operation to the bad memory block according to a result of detecting the bad memory block by the bad memory block detection unit.

The bad memory block detection unit may include: a test read management unit suitable for generating and updating a test read table for the plurality of memory blocks; and a test read operation unit suitable for controlling the memory device to perform the test read operation according to the test read table.

The test read table may have information about whether a read operation is performed to the plurality of memory blocks for a predetermined time.

The test read table may have flags of a high logic for memory blocks, to which a read operation is performed for the predetermined time, and flags of a low logic for memory blocks, to which a read operation is not performed for the predetermined time.

The test read operation unit may control the memory device to perform a test read operation to a random block among the memory blocks corresponding to the flag of the high logic.

The test read table may have information about memory blocks, to which a read operation is performed for the predetermined time, and the information of memory blocks includes addresses of the memory blocks.

The test read operation unit may control the memory device to perform a test read operation to a random block among the memory blocks corresponding to the information of the test read table.

The test read table may have information about super memory blocks each including a plurality of memory blocks.

The respective super memory blocks may share a memory block with each other, and the test read operation unit may control the memory device to perform a test read operation to the plurality of memory blocks included in each of the super memory blocks.

The test read operation unit may control the memory device to perform a test read operation to a random block among the memory blocks included in the super memory blocks corresponding to the information of the test read table.

In accordance with an embodiment of the present invention, an operating method for a memory system may include: a bad memory block detection step of performing a test read operation on the plurality of memory blocks to detect a bad memory block; and a read reclaim step of performing a read reclaim operation to the bad memory block according to a result of the bad memory block detection step.

The bad memory block detection step may include: generating and updating a test read table for the plurality of memory blocks; and performing the test read operation according to the test read table.

The test read table may have information about whether a read operation is performed to the plurality of memory blocks for a predetermined time.

The test read table may have flags of a high logic for memory blocks, to which a read operation is performed for the predetermined time, and flags of a low logic for memory blocks, to which a read operation is not performed for the predetermined time.

The performing of the test read operation may include performing a test read operation to a random block among the memory blocks corresponding to the flag of the high logic.

The test read table may have information about memory blocks, to which a read operation is performed for the predetermined time, and the information of memory blocks may include addresses of the memory blocks.

The performing of the test read operation may include performing a test read operation to a random block among the memory blocks corresponding to the information of the test read table.

The test read table may have information about super memory blocks each including a plurality of memory blocks.

The respective super memory blocks may share a memory block with each other, and the performing of the test read operation may include performing a test read operation to the plurality of memory blocks included in each of the super memory blocks.

The performing of the test read operation may include performing a test read operation to a random block among the memory blocks included in the super memory blocks corresponding to the information of the test read table.

In accordance with an embodiment of the present invention, a memory system may include a memory device including a plurality of memory blocks; and a controller suitable for: performing a test read operation on a per-block basis, when a read count of each memory block is not recognized; determining whether each memory block is affected by a read disturbance based on the test read operation; and performing a read reclaim operation on a per-block basis when at least one memory block is affected by the read disturbance.

BRIEF DESCRIPTION OF THE DRAWINGS

FIG. 6A is a diagram illustrating the test read table included in the test read management unit.

FIG. 6B is a diagram illustrating the test read table included in the test read management unit.

DETAILED DESCRIPTION

Figure 1:
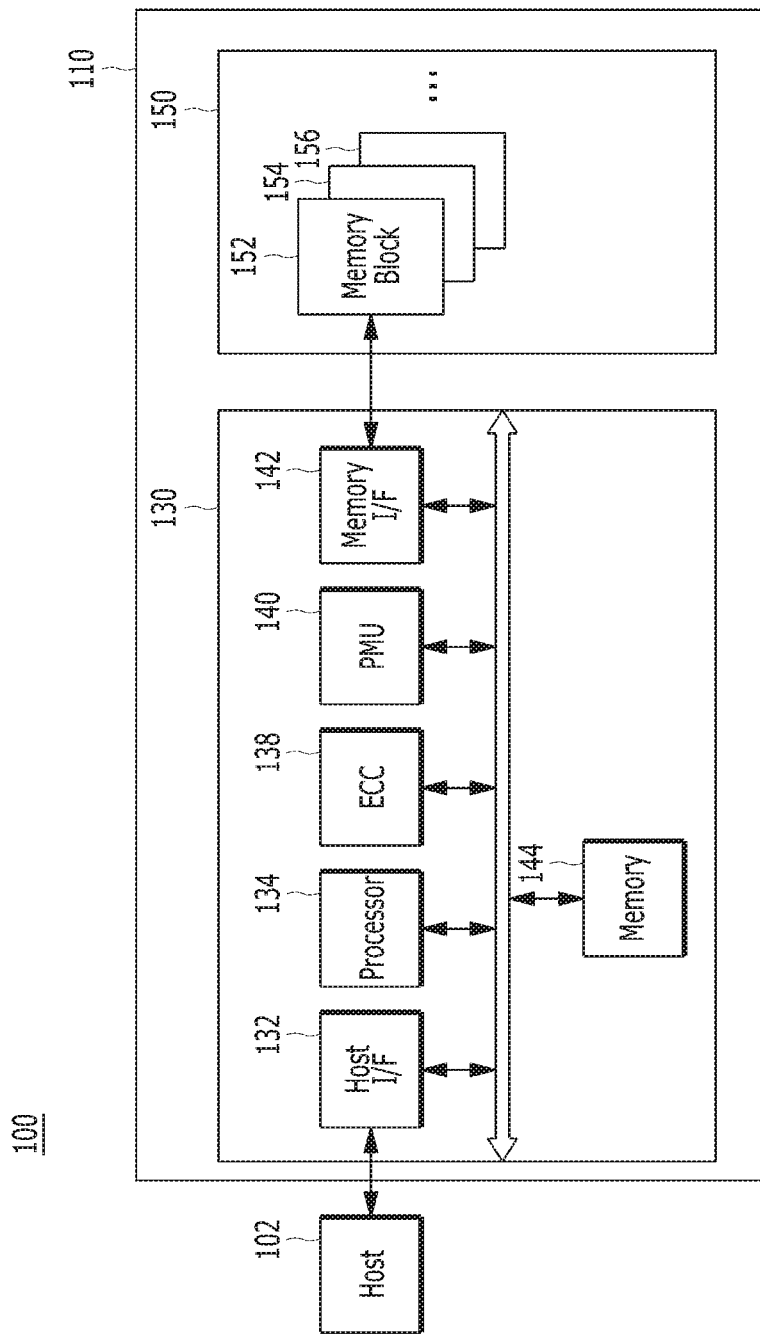
FIG. 1 is a block diagram illustrating a data processing system including a memory system, in accordance with an embodiment of the present invention.

Various embodiments of the invention are described below in more detail with reference to the accompanying drawings. We note, however, that the invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for describing particular embodiments only and is not intended to be limiting of the invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention belongs in view of the disclosure. It will be further understood that terms, such as those defined in commonly used dictionaries, should be interpreted as having a meaning that is consistent with their meaning in the context of the disclosure and the relevant art and will not be interpreted in an idealized or overly formal sense unless expressly so defined herein.

In the following description, numerous specific details are set forth in order to provide a thorough understanding of the invention. The present invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the invention.

Referring to FIG. 1, the data processing system 100 may include a host 102 engaged with a memory system 110.

By way of example but not limitation, the host 102 may include, for example, a portable electronic device such as a mobile phone, an MP3 player, and a laptop computer or an electronic device such as a desktop computer, a game player, a TV, a projector, and the like.

The memory system 110 may operate in response to a request from the host 102. Particularly, the memory system 110 may store data inputted or accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static RAM (SRAM) and nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM) and a flash memory.

The memory system 110 may include a memory device 150, which stores data to be accessed by the host 102, and a controller 130 which may control storage of data in the memory device 150.

The controller 130 and the memory device 150 may be integrated into a single semiconductor device, which may be included in the various types of memory systems as exemplified above.

The memory system 110 may be configured as part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 150 may be a nonvolatile memory device to retain data stored therein even though power is not supplied. The memory device 150 may store data entered from the host 102 during a write operation, and output data stored therein to the host 102 during a read operation. The memory device 150 may include a plurality of memory blocks 152 to 156, each of the memory blocks 152 to 156 may include a plurality of pages. Each of the pages may include a plurality of memory cells to which a plurality of word lines WL are electrically coupled.

The controller 130 may control overall operations of the memory device 150, such as read, write, program, and erase operations. For example, the controller 130 of the memory system 110 may control the memory device 150 in response to a request from the host 102. The controller 130 may provide the data read from the memory device 150, to the host 102, and/or may store the data provided from the host 102 into the memory device 150.

The controller 130 may include a host interface (I/F) unit 132, a processor 134, an error correction code (ECC) unit 138, a power management unit (PMU) 140, a memory interface/F unit 142 such as a NAND flash controller (NFC), and a memory 144, each engaged with each other via an internal bus.

The host interface unit 132 may process commands and data provided from the host 102. The host interface unit 134 may communicate with the host 102 under at least one of various interface protocols such as universal serial bus (USB), multimedia card (MMC), peripheral component interconnect-express (PCI-E), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, modules, systems, or devices for the error correction operation.

The PMU 140 may provide and manage power of the controller 130.

The memory interface unit 142 may serve as a memory/storage interface between the controller 130 and the memory device 150 to allow the controller 130 to control the memory device 150 in response to a request from the host 102. The memory interface unit 142 may generate a control signal for the memory device 150 and process data to be provided to the memory device 150 under the control of the processor 134 when the memory device 150 is a flash memory and, in particular, when the memory device 150 is a NAND flash memory. It is noted that the invention is not limited to NAND flash memory/NAND flash interface, and that a suitable memory/storage interface may be selected depending upon the type of the memory device 150.

The memory 144 may serve as a working memory of the memory system 110 and the controller 130, and store data for driving the memory system 110 and the controller 130. The controller 130 may control the memory device 150 in response to a request from the host 102. The controller 130 may provide data read from the memory device 150 to the host 102, while storing data provided from the host 102 into the memory device 150. The memory 144 may store data required for the controller 130 and the memory device 150 to perform these operations.

The memory 144 may be implemented with a volatile memory. The memory 144 may be implemented with a static random access memory (SRAM) or a dynamic random access memory (DRAM). Although FIG. 1 shows the memory 144 inside controller 130, it is for illustrative purposes only, and the disclosure is not limited thereto. That is, the memory 144 may be disposed within or out of the controller 130. In another embodiment, the memory 144 may be embodied by an external volatile memory having a memory interface transferring data between the memory 144 and the controller 130.

The processor 134 may control the overall operations of the memory system 110. The processor 134 may use a firmware, which is referred to as a flash translation layer (FTL), to control general operations of the memory system 110.

The FTL may perform an operation as an interface between the host 102 and the memory device 150. The host 102 may request to the memory device 150 write and read operations through the FTL.

The FTL may manage operations of address mapping, garbage collection, wear-leveling, and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, when the controller 130 updates data of a particular page, the controller 130 may perform the address mapping operation based on the map data to program new data into another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134, and may perform bad block management of the memory device 150. The management unit may find bad memory blocks included in the memory device 150, which are in unsatisfactory condition for further use. The management unit may perform bad block management on the bad memory blocks. When the memory device 150 is a flash memory such as a NAND flash memory, a program failure may occur during the write operation (i.e., during the program operation), due to characteristics of a NAND logic function. During the bad block management, the data of the program-failed memory block or the bad memory block may be programmed into a new memory block. Also, the bad blocks due to the program fail seriously deteriorate the utilization efficiency of the memory device 150 having a 3D stack structure and the reliability of the memory system 100, and thus reliable bad block management is needed.

Figure 2:
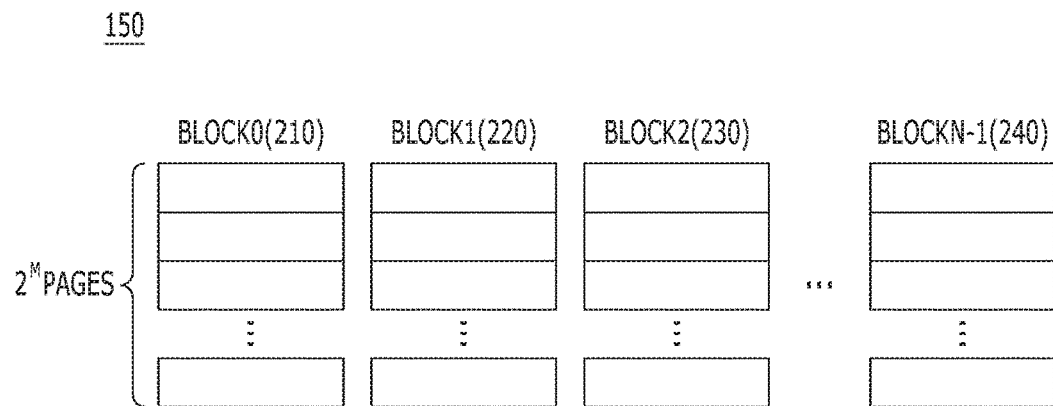
FIG. 2 is a schematic diagram illustrating an exemplary configuration of a memory device employed in the memory system shown in FIG. 1.

FIG. 2 is a schematic diagram illustrating the memory device 150 of FIG. 1.

Referring to FIG. 2, the memory device 150 may include the plurality of memory blocks BLOCK 0 to BLOCKN−1. Here, N is an integer larger than 1. Each of the blocks BLOCK 0 to BLOCKN−1 may include a plurality of pages, for example, $2^M$ pages, the number of which may vary according to circuit design. Here, M is an integer larger than 1. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells, each capable of storing 3-bit data, may be referred to as a triple level cell (TLC) memory block.

Each of the plurality of memory blocks 210 to 240 may store the data provided from the host device 102 during a write operation, and may provide stored data to the host 102 during a read operation.

Figure 3:
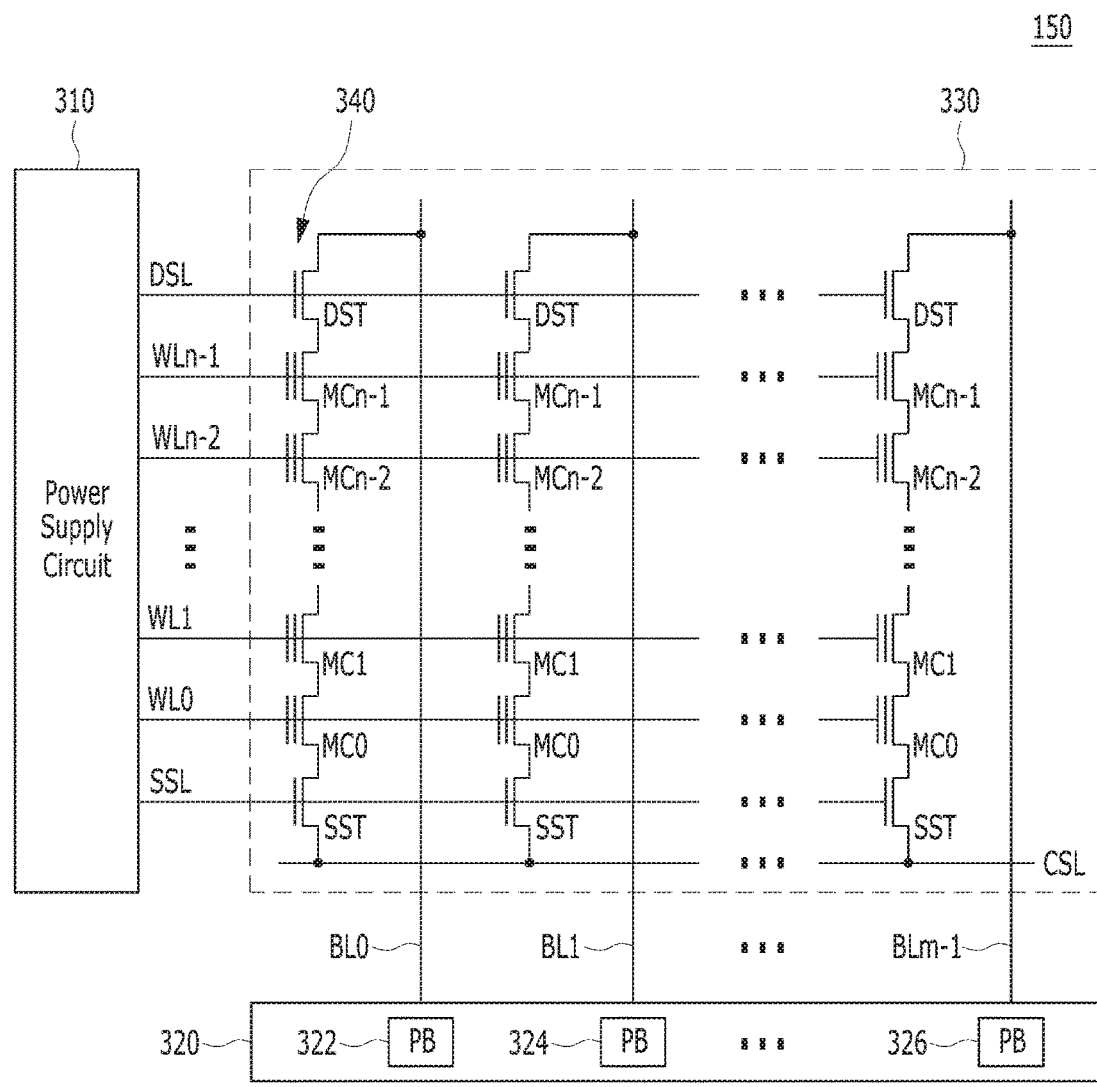
FIG. 3 is a circuit diagram illustrating an exemplary configuration of a memory cell array of a memory block in the memory device shown in FIG. 2.

FIG. 3 is a circuit diagram illustrating a memory cell array 330 in the memory device 150 of FIGS. 1 and 2.

Referring to FIG. 3, the memory cell array 330 may correspond to any of the plurality of memory blocks 152 to 156 shown in FIG. 1.

Referring to FIG. 3, the memory cell array 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC), each storing 1 bit of information, or multi-level cells (MLC), each storing multi-bit information. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 only shows, as an example, the memory cell array 330 which is configured by NAND flash memory cells, it is to be noted that the memory cell array 330 of the memory device 150 according to the embodiment is not limited to NAND flash memory. According to embodiments, the memory cell array 330 may be implemented with NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may generate different word line voltages, for example, a program voltage, a read voltage and a pass voltage, to supply one of the voltages to respective word lines according to an operation mode. The word line voltage may be determined based at least on voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select at least one of the memory blocks or sectors of a memory cell array under the control of the control circuit, select at least one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification or a normal read operation, the read/write circuit 320 may operate as a sense amplifier for reading data from the memory cell array. During a program operation, the read/write circuit 320 may work as a write driver for supplying a voltage or a current into bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
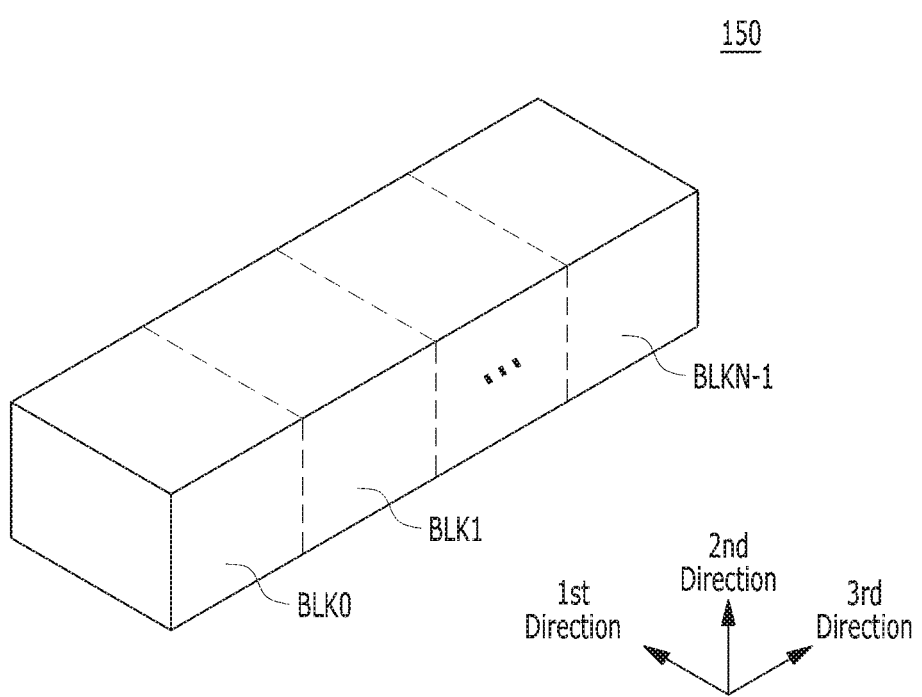
FIG. 4 is a schematic diagram illustrating an exemplary three-dimensional structure of the memory device shown in FIG. 2.

FIG. 4 is a schematic diagram illustrating a three-dimensional (3D) structure of the memory device 150 of FIGS. 1 and 2.

The memory device 150 may be embodied by a two-dimensional (2D) or a three-dimensional (3D) memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1, each having a 3D structure (or vertical structure).

Figure 5:
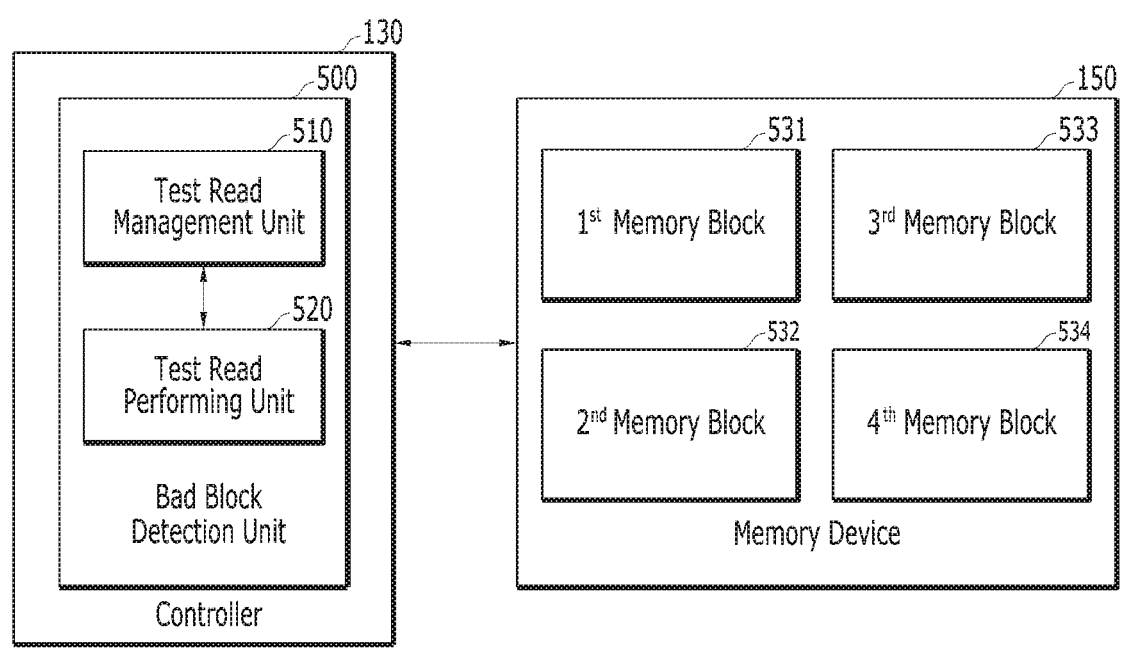
FIG. 5 is a diagram illustrating a memory system capable of performing a read reclaim operation by detecting a bad memory block through a test read operation.

FIG. 5 is a diagram illustrating a memory system capable of performing a read reclaim operation by detecting a bad memory block through a test read operation.

To perform a read reclaim operation to a memory block, a read count for each memory block should be individually stored and managed. Such read count provides precise information about a bad memory block. However, in a case when the read count is not known due to a sudden power off (SPO) and so forth, it is hard for a controller to find a bad memory block as a target of a read reclaim operation.

To avoid this issue, in accordance with an embodiment of the invention, a bad memory block detection unit 500 may detect a memory block having a high probability to be considered a bad memory block.

The bad memory block detection unit 500 may detect a bad memory block as a target of a read reclaim operation through a test read operation to a plurality of memory blocks included in the memory device 150.

In detail, the bad memory block detection unit 500 may include a test read management unit 510 and a test read operation unit 520. The test read management unit 510 may generate and update a test read table for the plurality of memory blocks. The test read operation unit 520 may control the memory device 150 to perform a test read operation according to the test read table. The bad block detection unit 500, the test read management unit 510, and the test read operation unit 520 may include all circuits, systems, firmware and devices necessary for their respective operations and functions.

The test read management unit 510 may manage information of memory blocks, to which a test read operation is to be performed. The memory blocks managed by the test read management unit 510 may have a high probability to be bad memory blocks.

For example, a memory block having a greatest read count recently for a predetermined time may have a high probability to be a bad memory block.

The test read operation unit 520 may detect a bad memory block as a target of a read reclaim operation by performing a test read operation to the memory blocks managed by the test read management unit 510.

The test read operation unit 520 may refer to the test read table at various time points. For example, the test read operation unit 520 may refer to the test read table before performing a read operation when a read request is provided from a host.

In detail, the test read operation unit 520 may control the memory device 150 to perform a test read operation to the memory blocks managed by the test read management unit 510, and may detect a bad memory block among the memory blocks, to which the test read operation is performed, by obtaining read disturbance information of the memory blocks, to which the test read operation is performed.

The read disturbance information may represent a factor that may cause a read fail due to increase of a threshold voltage. For example, the read disturbance information may represent a status in which a non-selected memory cell is soft-programmed under a bias condition of a read operation since electrons are injected into a floating gate of the non-selected memory cell during the read operation.

The controller 130 may control the memory device 150 to perform a read reclaim operation to the memory blocks detected as bad memory blocks according to a result of the test read operation of the test read operation unit 520.

In an embodiment, the bad memory block detection unit 500 may be included in the controller 130 or in the memory device 150. In an embodiment, the bad memory block detection unit 500 may be implemented as hardware or software. The location and implementation of the bad memory block detection unit 500 may vary.

FIG. 6A is a diagram illustrating the test read table 611A included in the test read management unit 510.

The test read table 611A may have information about whether a read operation is performed to the plurality of memory blocks in the memory device 150 for a predetermined time.

The test read table 611A may have the information about all or some memory blocks included in the memory device 150.

The predetermined time may correspond to a period of updating the test read table 611A by the test read management unit 510. Also, the predetermined time may satisfy a condition that a reliability of detecting bad memory blocks with a predetermined probability or more has a predetermined value or more.

The above-described predetermined time will not limit the scope of the invention. In an embodiment, the predetermined time may be predetermined by a user of the memory system. In an embodiment, the predetermined time may be defined according to various conditions and operating environments.

Referring to FIG. 6A, the test read table 611A may have flags indicating whether a read operation is performed to each memory block for a predetermined time.

When a read operation is performed to a first memory block 531 and a third memory block 533 for a predetermined time, the test read table 611A may have flags of high logic for the first memory block 531 and the third memory block 533.

In similar way, when a read operation is not performed to a second memory block 532 and a fourth memory block 534 for a predetermined time, the test read table 611A may have flags of low logic for the second memory block 532 and the fourth memory block 534.

Accordingly, the test read operation unit 520 may control the memory device 150 to perform a test read operation to the first memory block 531 and the third memory block 533.

In an embodiment, the test read operation unit 520 may control the memory device 150 to perform a test read operation to a random block between the first memory block 531 and the third memory block 533. In this description, although two of the first memory block 531 and the third memory block 533 are exemplified as targets of a test read operation according to information of the test read table 611A, a plurality of memory blocks may be targets of a test read operation according to information of the test read table 611A. In such a case, the test read operation unit 520 may control the memory device 150 to perform a test read operation to a random block among the plurality of memory blocks according to information of the test read table 611A.

In an embodiment, when the test read table 611A has all flags of low logic, the test read operation unit 520 may control the memory device 150 to perform a test read operation to a random block among all of the plurality of memory blocks corresponding to information of the test read table 611A or a random block among all of the plurality of memory blocks included in the memory device 150.

The test read operation unit 520 may control the memory device 150 to perform a test read operation to the memory blocks managed by the test read management unit 510. The test read operation unit 520 may detect a bad memory block among the memory blocks, to which the test read operation is performed, by obtaining read disturbance information of the memory blocks to which the test read operation is performed.

According to the result of the test read operation, the controller 130 may control the memory device 150 to perform a read reclaim operation to one or more memory blocks detected as bad memory blocks between the first memory block 531 and the third memory block 533.

FIG. 6B is a diagram illustrating the test read table 611B included in the test read management unit 510.

The test read table 611B may have information about whether a read operation is performed to super memory blocks included in the memory device 150 for a predetermined time.

The test read table 611B may have the information of all or some super memory blocks included in the memory device 150.

The predetermined time may correspond to a period of updating the test read table 611B by the test read management unit 510. Also, the predetermined time may satisfy a condition that a reliability of detecting bad memory blocks with a predetermined probability or more has a predetermined value or more.

The above-described predetermined time will not limit the scope of the invention. In an embodiment, the predetermined time may be predetermined by a user of the memory system. In an embodiment, the predetermined time may be defined according to various conditions and operating environments.

Referring to FIG. 6B, the test read table 611B may have flags according to whether a read operation is performed to each super memory block for a predetermined time.

A first super memory block may include the first memory block 531 and the second memory block 532, a second super memory block may include the second memory block 532 and the third memory block 533, a third super memory block may include the third memory block 533 and the fourth memory block 534, and a fourth super memory block may include the fourth memory block 534 and the first memory block 531.

When a read operation is performed to the first super memory block and the fourth super memory block for a predetermined time, the test read table 611B may have flags of high logic for the first super memory block and the fourth super memory block.

In similar way, when a read operation is not performed to the second super memory block and the third super memory block for a predetermined time, the test read table 611B may have flags of low logic for the second super memory block and the third super memory block.

Accordingly, the test read operation unit 520 may control the memory device 150 to perform a test read operation to the first super memory block and the fourth super memory block.

That is, the test read operation unit 520 may control the memory device 150 to perform a test read operation to the first memory block 531 and the second memory block 532 included in the first super memory block and to the fourth memory block 534 and the first memory block 531 included in the fourth super memory block.

As described above, the first to fourth super memory blocks may share the first to fourth memory blocks 531 to 534 with each other. Therefore, the test read operation unit 520 may control the memory device 150 to repeatedly perform a test read operation to the first memory block 531 when the first memory block 531 is shared by the first and fourth super memory blocks.

That is, the first memory block 531 shared by the first and fourth super memory blocks may have a high probability of a bad memory block.

In an embodiment, the test read operation unit 520 may control the memory device 150 to perform a test read operation to a random block among the first memory block 531 and the second memory block 532 included in the first super memory block and the fourth memory block 534 and the first memory block 531 included in the fourth super memory block. In this description, although three of the first, second and fourth memory blocks 531, 532, 534 are exemplified as targets of a test read operation according to information of the test read table 611B, a plurality of memory blocks may be targets of a test read operation according to information of the test read table 611B. In such case, the test read operation unit 520 may control the memory device 150 to perform a test read operation to a random block among the plurality of memory blocks according to information of the test read table 611B.

In an embodiment, when the test read table 611B has all flags of low logic, the test read operation unit 520 may control the memory device 150 to perform a test read operation to a random block among all of the plurality of super memory blocks corresponding to information of the test read table 611B or a random block among all of the plurality of super memory blocks included in the memory device 150.

The test read operation unit 520 may control the memory device 150 to perform a test read operation to the memory blocks managed by the test read management unit 510. The test read operation unit 520 may detect a bad memory block among the memory blocks, to which the test read operation is performed, by obtaining read disturbance information of the memory blocks, to which the test read operation is performed.

According to the result of the test read operation, the controller 130 may control the memory device 150 to perform a read reclaim operation to one or more memory blocks detected as bad memory blocks among the first, second and fourth memory blocks 531, 532, 534.

Figure 7A:
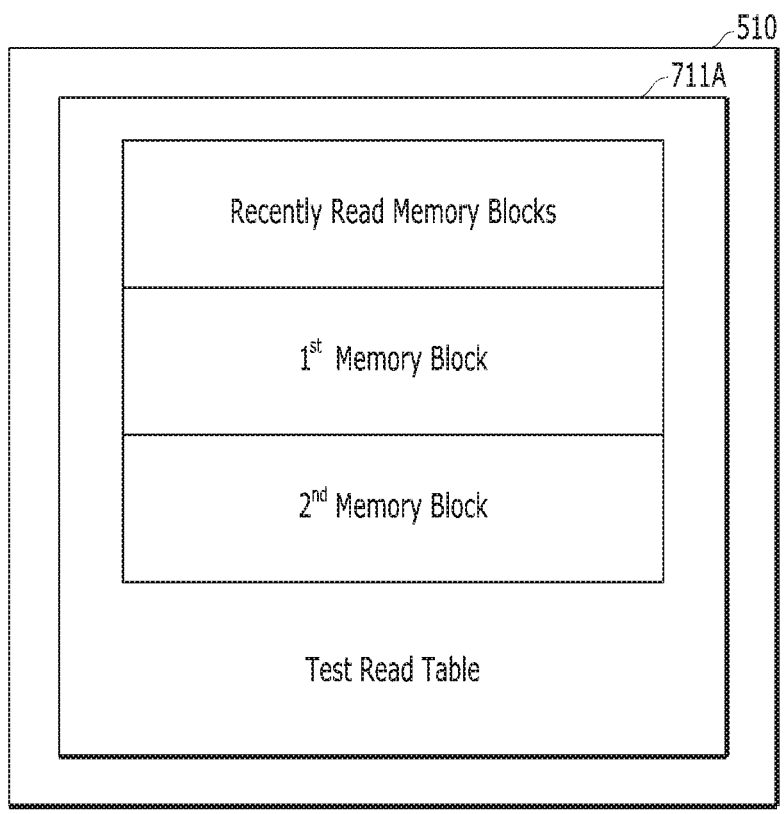
FIG. 7A is a diagram illustrating the test read table included in the test read management unit.

FIG. 7A is a diagram illustrating the test read table 711A included in the test read management unit 510.

The test read table 711A may have information of memory blocks, to which a read operation is performed in the memory device 150 for a predetermined time.

The predetermined time may correspond to a period of updating the test read table 711A by the test read management unit 510. Also, the predetermined time may satisfy a condition that a reliability of detecting bad memory blocks with a predetermined probability or more has a predetermined value or more.

The above-described predetermined time will not limit the scope of the invention. In an embodiment, the predetermined time may be predetermined by a user of the memory system.

In an embodiment, the predetermined time may be defined according to various conditions and operating environments.

When a read operation is performed to the first memory block 531 and the third memory block 533 for a predetermined time, the test read table 711A may have information of the first memory block 531 and the third memory block 533.

The information of a memory block in the test read table 711A may include information of the logical address or the physical address of the memory block.

Accordingly, the test read operation unit 520 may control the memory device 150 to perform a test read operation to the first memory block 531 and the third memory block 533.

In an embodiment, the test read operation unit 520 may control the memory device 150 to perform a test read operation to a random block between the first memory block 531 and the third memory block 533. In this description, although two of the first memory block 531 and the third memory block 533 are exemplified as targets of a test read operation according to information of the test read table 711A, a plurality of memory blocks may be determined as targets of a test read operation according to information of the test read table 711A. In such case, the test read operation unit 520 may control the memory device 150 to perform a test read operation to a random block among the plurality of memory blocks according to information of the test read table 711A.

In an embodiment, when the test read table 711A does not have any information of a memory block, the test read operation unit 520 may control the memory device 150 to perform a test read operation to a random block among all of the plurality of memory blocks included in the memory device 150.

The test read operation unit 520 may control the memory device 150 to perform a test read operation to the memory blocks managed by the test read management unit 510. The test read operation unit 520 may detect a bad memory block among the memory blocks, to which the test read operation is performed, by obtaining read disturbance information of the memory blocks, to which the test read operation is performed.

According to the result of the test read operation, the controller 130 may control the memory device 150 to perform a read reclaim operation to one or more memory blocks detected as bad memory blocks between the first memory block 531 and the third memory block 533.

Figure 7B:
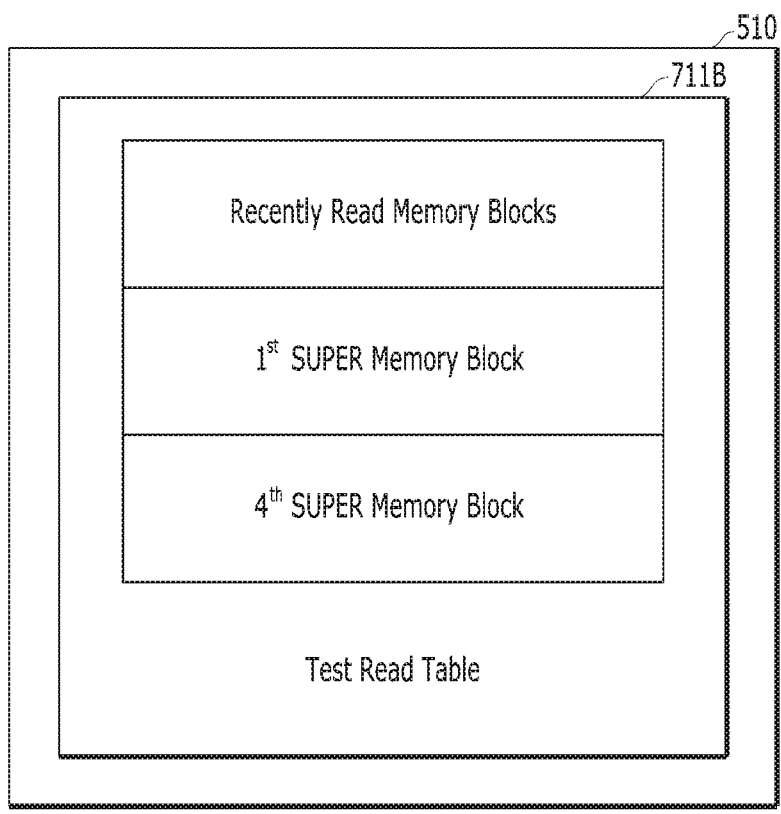
FIG. 7B is a diagram illustrating the test read table included in the test read management unit.

FIG. 7B is a diagram illustrating the test read table 711B included in the test read management unit 510.

The test read table 611B may have information of super memory blocks, to which a read operation is performed in the memory device 150 for a predetermined time.

The predetermined time may correspond to a period of updating the test read table 711B by the test read management unit 510. Also, the predetermined time may satisfy a condition that a reliability of detecting bad memory blocks with a predetermined probability or more has a predetermined value or more.

The above-described predetermined time will not limit the scope of the invention. In an embodiment, the predetermined time may be predetermined by a user of the memory system. In an embodiment, the predetermined time may be defined according to various conditions and operating environments.

When a read operation is performed to the first super memory block and the fourth super memory block for a predetermined time, the test read table 711B may have information of the first super memory block and the fourth super memory block.

The first super memory block may include the first memory block 531 and the second memory block 532, the second super memory block may include the second memory block 532 and the third memory block 533, the third super memory block may include the third memory block 533 and the fourth memory block 534, and the fourth super memory block may include the fourth memory block 534 and the first memory block 531.

The information of a super memory block in the test read table 711B may include information of the logical address or the physical address of the super memory block.

Accordingly, the test read operation unit 520 may control the memory device 150 to perform a test read operation to the first super memory block and the fourth super memory block.

The test read operation unit 520 may control the memory device 150 to perform a test read operation to the first memory block 531 and the second memory block 532 included in the first super memory block as well as the fourth memory block 534 and the first memory block 531 included in the fourth super memory block.

As described above, the first to fourth super memory blocks may share the first to fourth memory blocks 531 to 534 with each other. Therefore, the test read operation unit 520 may control the memory device 150 to repeatedly perform a test read operation to the first memory block 531 when the first memory block 531 is shared by the first and fourth super memory blocks.

That is, the first memory block 531 shared by the first and fourth super memory blocks may have a high probability of a bad memory block.

The test read operation unit 520 may control the memory device 150 to perform a test read operation to the memory blocks managed by the test read management unit 510. The test read operation unit 520 may detect a bad memory block among the memory blocks, to which the test read operation is performed, by obtaining read disturbance information of the memory blocks, to which the test read operation is performed.

In an embodiment, the test read operation unit 520 may control the memory device 150 to perform a test read operation to a random block among the first memory block 531 and the second memory block 532 included in the first super memory block, and the fourth memory block 534 and the first memory block 531 included in the fourth super memory block. In this description, although three of the first, second and fourth memory blocks 531, 532, 534 are exemplified as targets of a test read operation according to information of the test read table 711B, a plurality of memory blocks may be considered targets of a test read operation according to information of the test read table 711B. In such case, the test read operation unit 520 may control the memory device 150 to perform a test read operation to a random block among the plurality of memory blocks according to information of the test read table 711B.

In an embodiment, when the test read table 711A does not have any information of a super memory block, the test read operation unit 520 may control the memory device 150 to perform a test read operation to a random block among all of the plurality of super memory blocks included in the memory device 150.

According to the result of the test read operation, the controller 130 may control the memory device 150 to perform a read reclaim operation to one or more memory blocks detected as bad memory blocks among the first, second and fourth memory blocks 531, 532, 534.

Figure 8:
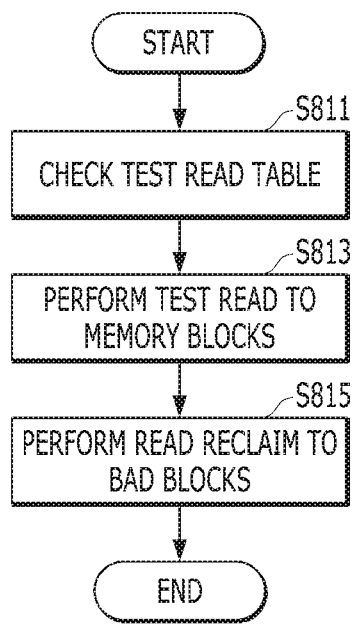
FIG. 8 is a flowchart illustrating an operating method of the memory system.

FIG. 8 is a flowchart illustrating an operating method for the memory system 100.

At step S811, the test read operation unit 520 may refer to the test read table included in the test read management unit 510.

The test read operation unit 520 may refer to the test read table at various time points. For example, the test read operation unit 520 may refer to the test read table before performing a read operation when a read request is provided from a host.

The test read table may have the information of all or some memory blocks included in the memory device 150.

At step S813, the test read operation unit 520 may control the memory device 150 to perform a test read operation to the memory blocks corresponding to the information of the test read table.

The test read operation unit 520 may control the memory device 150 to perform a test read operation to the memory blocks managed by the test read management unit 510. The test read operation unit 520 may detect a bad memory block among the memory blocks, to which the test read operation is performed, by obtaining read disturbance information of the memory blocks, to which the test read operation is performed.

At step S815, the controller 130 may control the memory device 150 to perform a read reclaim operation to one or more memory blocks detected as bad memory blocks among the memory blocks, to which the test read operation is performed.

Figure 9:
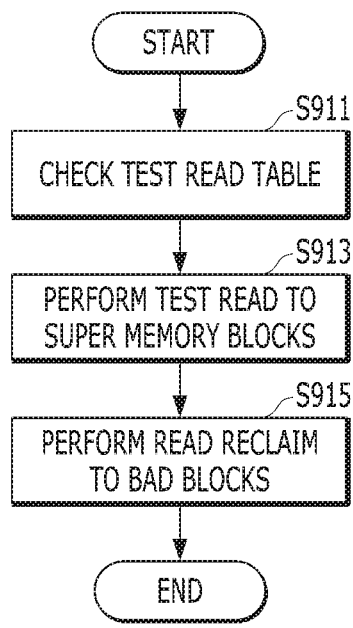
FIG. 9 is a flowchart illustrating an operating method of the memory system.

FIG. 9 is a flowchart illustrating an operating method for the memory system 100.

At step S911, the test read operation unit 520 may refer to the test read table included in the test read management unit 510.

The test read operation unit 520 may refer to the test read table at various time points. For example, the test read operation unit 520 may refer to the test read table before performing a read operation when a read request is provided from a host.

The test read table may have the information of all or some super memory blocks included in the memory device 150.

At step S913, the test read operation unit 520 may control the memory device 150 to perform a test read operation to the super memory blocks corresponding to the information of the test read table.

As described above, the super memory blocks may share the memory blocks with each other. Therefore, the test read operation unit 520 may control the memory device 150 to repeatedly perform a test read operation to the first memory block 531 when the first memory block 531 is shared by the first and fourth super memory blocks.

The test read operation unit 520 may control the memory device 150 to perform a test read operation to the super memory blocks managed by the test read management unit 510. The test read operation unit 520 may detect a bad memory block among the memory blocks, to which the test read operation is performed, by obtaining read disturbance information of the memory blocks, to which the test read operation is performed.

At step S915, the controller 130 may control the memory device 150 to perform a read reclaim operation to one or more memory blocks detected as bad memory blocks among the memory blocks, to which the test read operation is performed.

FIGS. 10 to 18 are diagrams schematically illustrating application examples of the data processing system of FIGS. 1 to 9 according to various embodiments.

Figure 10:
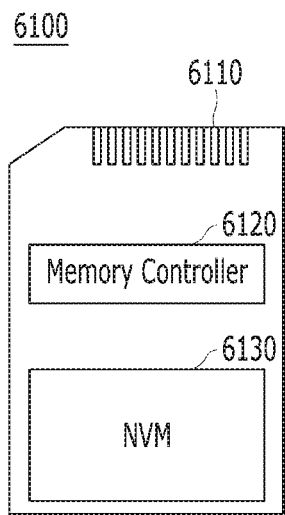
FIGS. 10 to 18 are diagrams schematically illustrating application examples of a data processing system, in accordance with various embodiments of the present invention.

FIG. 10 is a diagram schematically illustrating an example of the data processing system including the memory system in accordance with the present embodiment. FIG. 10 schematically illustrates a memory card system to which the memory system in accordance with the present embodiment is applied.

Referring to FIG. 10, the memory card system 6100 may include a memory controller 6120, a memory device 6130, and a connector 6110.

More specifically, the memory controller 6120, configured to access the memory device 6130, may be electrically connected to the memory device 6130 embodied by a nonvolatile memory. For example, the memory controller 6120 may be configured to control read, write, erase and background operations of the memory device 6130. The memory controller 6120 may be configured to provide an interface between the memory device 6130 and a host, and to use a firmware for controlling the memory device 6130. That is, the memory controller 6120 may correspond to the controller 130 of the memory system 110 described with reference to FIGS. 1 to 9, while the memory device 6130 may correspond to the memory device 150 of the memory system 110 described with reference to FIGS. 1 to 9.

Thus, the memory controller 6120 may include a RAM, a processing unit, a host interface, a memory interface and an error correction unit. The memory controller 130 may further include the elements described in FIG. 1.

The memory controller 6120 may communicate with an external device, for example, the host 102 of FIG. 1 through the connector 6110. By way of example but not limitation, as described with reference to FIG. 1, the memory controller 6120 may be configured to communicate with an external device using one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or specifically mobile electronic devices.

The memory device 6130 may be implemented by a nonvolatile memory. By way of example but not limitation, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC) and a universal flash storage (UFS).

Figure 11:
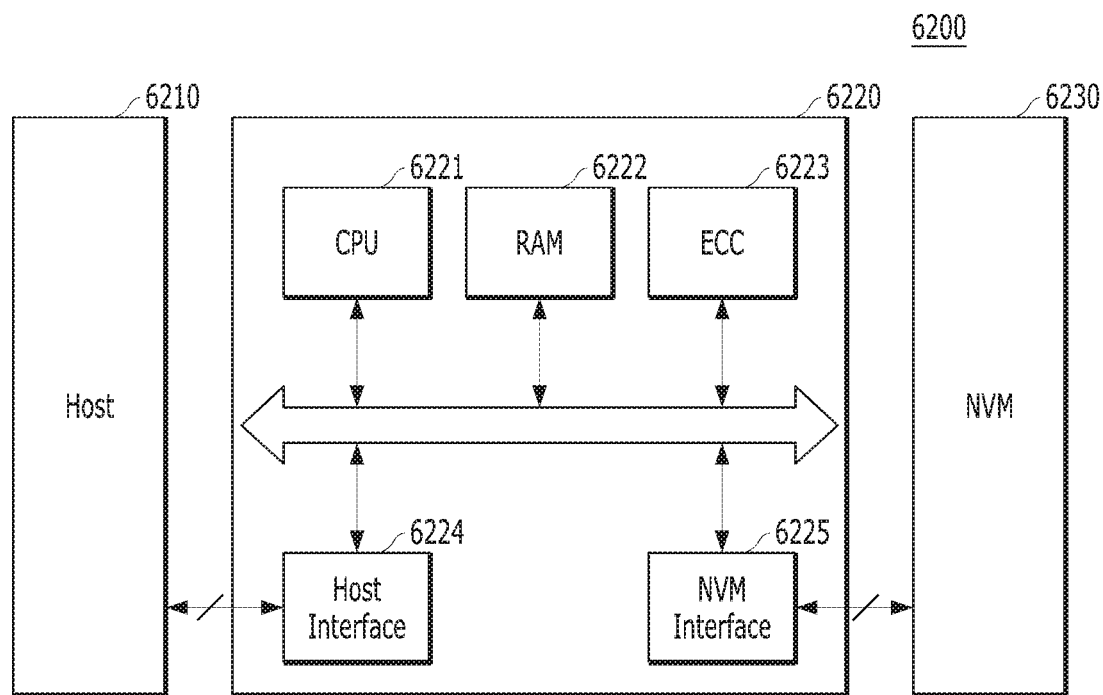

FIG. 11 is a diagram schematically illustrating an example of the data processing system including a memory system, in accordance with the present embodiment.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (a CF, a SD, a micro-SD or the like) or USB device, as described with reference to FIG. 1. The memory device 6230 may correspond to the memory device 150 in the memory system 110 described in FIGS. 1 to 9, while the memory controller 6220 may correspond to the controller 130 in the memory system 110 described in FIGS. 1 to 9.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may carry out a wireless communication function with a mobile communication protocol such as WiFi or Long Term Evolution (LTE). The memory controller 6220 may be connected to an external device, for example, the host 6210 or another external device, and then transmit/receive data to/from the external device. As the memory controller 6220 is configured to communicate with the external device through one or more of various communication protocols, the memory system and the data processing system in accordance with the present embodiment may be applied to wired/wireless electronic devices or particularly a mobile electronic device.

Figure 12:
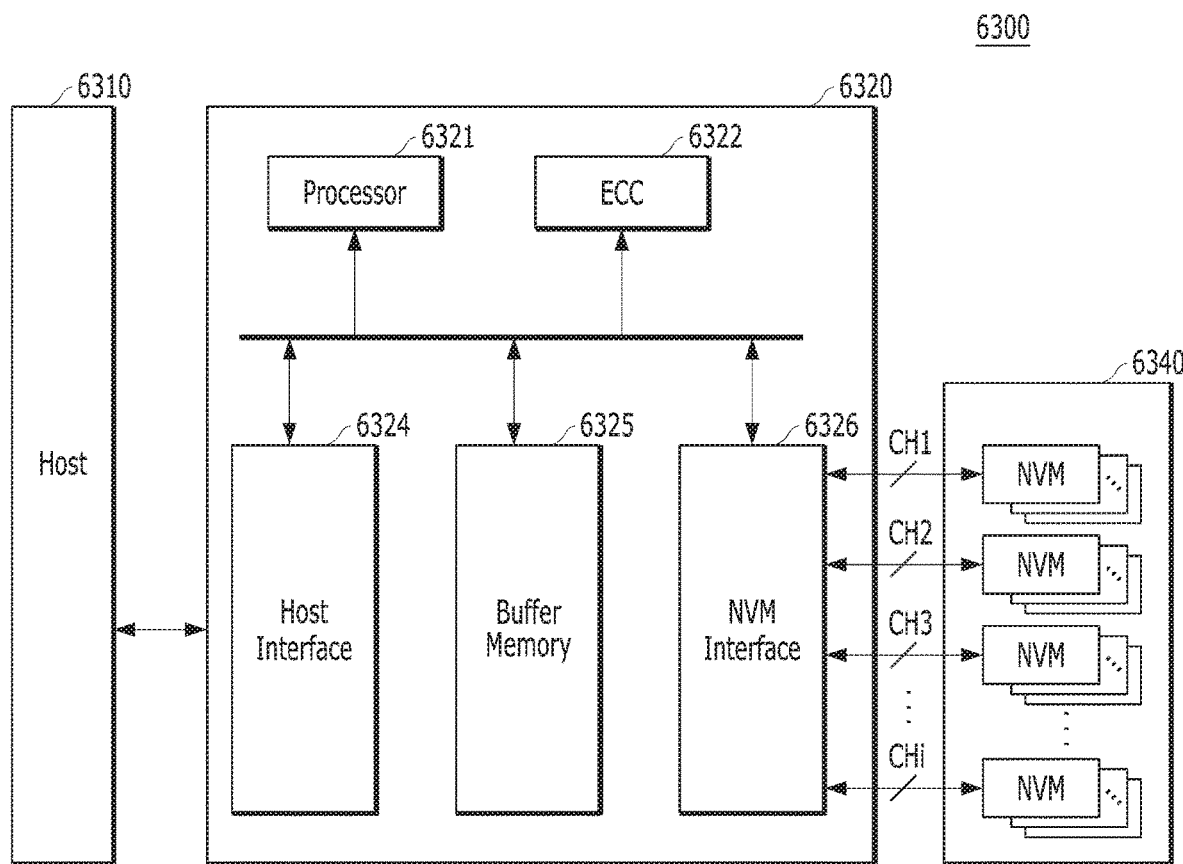

FIG. 12 is a diagram schematically illustrating an example of the data processing system including the memory system in accordance with the present embodiment. FIG. 12 schematically illustrates an SSD to which the memory system in accordance with the present embodiment is applied.

Referring to FIG. 12, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by volatile memories such as a DRAM, a SDRAM, a DDR SDRAM, a LPDDR SDRAM and a GRAM or nonvolatile memories such as a FRAM, a ReRAM, a STT-MRAM and a PRAM. For convenience of description, FIG. 12 illustrates that the buffer memory 6325 exists in the controller 6320. However, the buffer memory 6325 may be located outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, to output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, to output data read from the selected SSDs 6300 to the host 6310.

Figure 13:
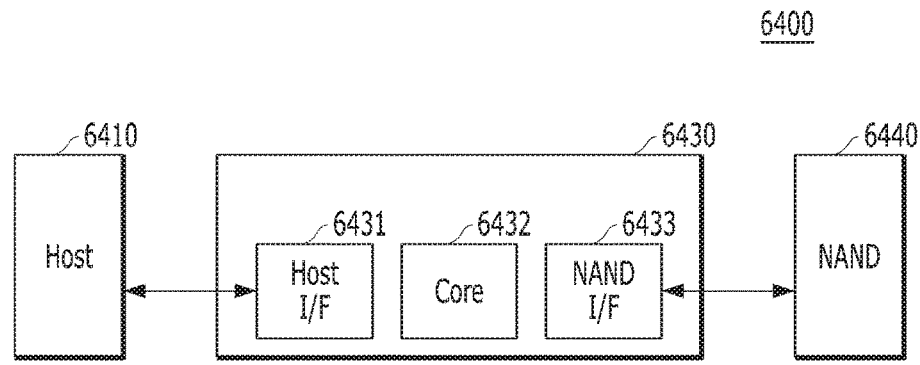
Figure 14:
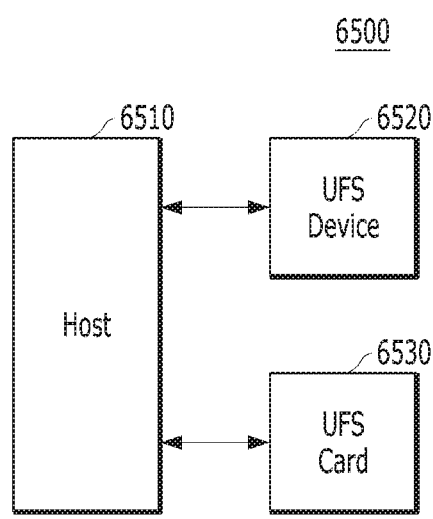
Figure 15:
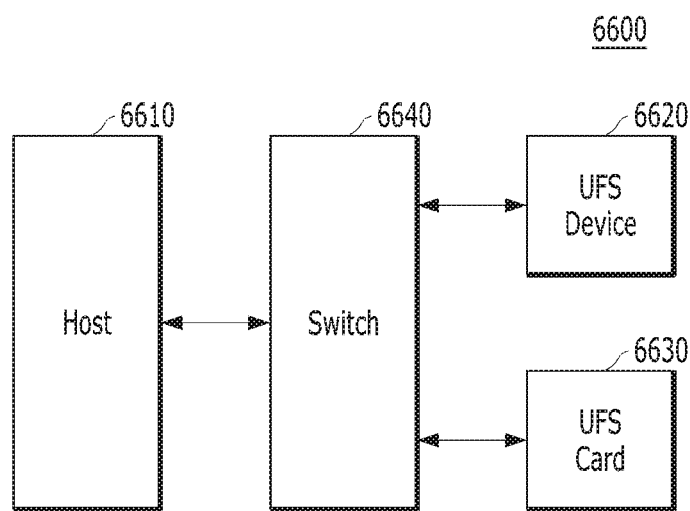
Figure 16:
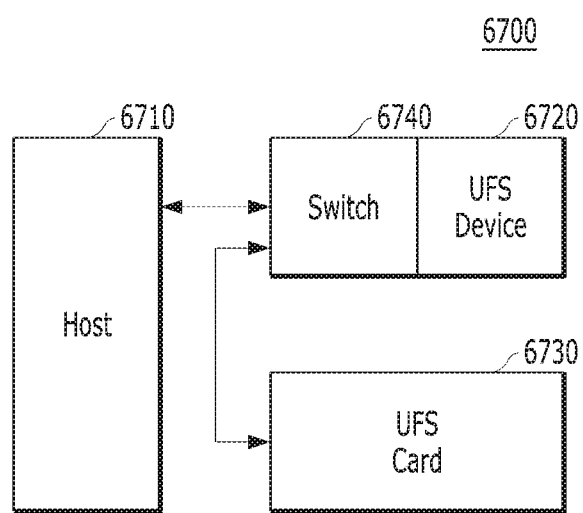
Figure 17:
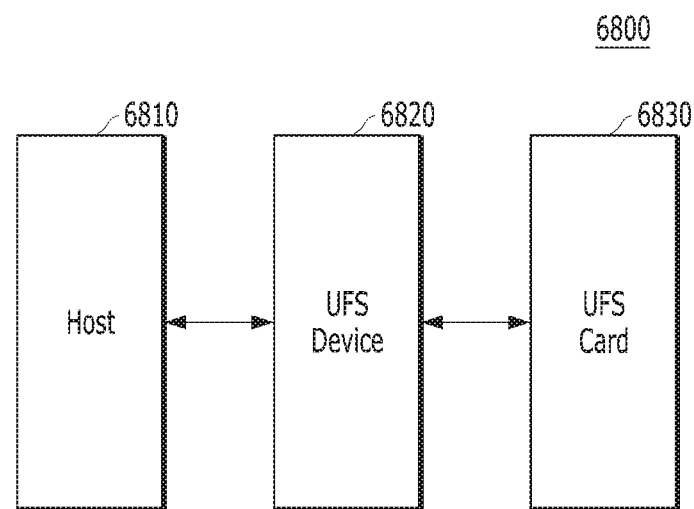

FIG. 13 is a diagram schematically illustrating an example of the data processing system including the memory system in accordance with an embodiment. FIG. 13 schematically illustrates an embedded Multi-Media Card (eMMC) to which the memory system in accordance with an embodiment is applied.

Referring to FIG. 13, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control the operations of the eMMC 6400, and the host interface 6431 may provide an interface function between the controller 6430 and the host 6410. The NAND interface 6433 may provide an interface function between the memory device 6440 and the controller 6430. By way of example but not limitation, the host interface 6431 may serve as a parallel interface such as a MMC interface as described with reference to FIG. 1. Furthermore, the host interface 6431 may serve as a serial interface, for example, UHS ((Ultra High Speed)-I/UHS-II) interface.

FIGS. 14 to 17 are diagrams schematically illustrating other examples of the data processing system including the memory system in accordance with an embodiment. FIGS. 14 to 17 schematically illustrate UFS (Universal Flash Storage) systems to which the memory system in accordance with an embodiment is applied.

Referring to FIGS. 14 to 17, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices or particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices or particularly mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 11 to 13, and the UFS cards 6530, 6630, 6730, 6830 may be embodied in the form of the memory card system 6100 described with reference to FIG. 10.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other using various protocols other than the UFS protocol, for example, a UFDs, a MMC, a SD, a mini-SD, and a micro-SD.

Figure 18:
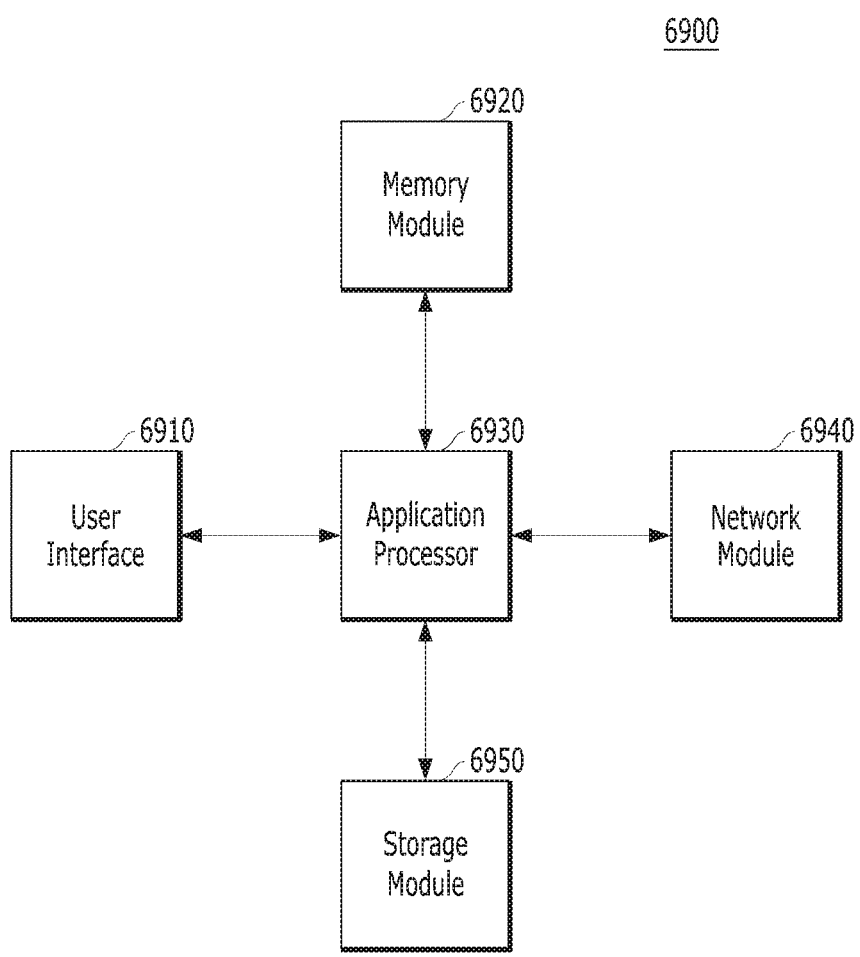

FIG. 18 is a diagram schematically illustrating another example of the data processing system including the memory system in accordance with an embodiment. FIG. 18 is a diagram schematically illustrating a user system to which the memory system in accordance with an embodiment is applied.

Referring to FIG. 18, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile RAM such as a DRAM, a SDRAM, a DDR SDRAM, a DDR2 SDRAM, a DDR3 SDRAM, a LPDDR SDARM, a LPDDR3 SDRAM or a LPDDR3 SDRAM or a nonvolatile RAM such as a PRAM, a ReRAM, a MRAM or a FRAM. For example, the application processor 6930 and the memory module 6920 may be packaged and mounted, based on POP (Package on Package).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and a UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as defined in the following claims.

What is claimed is:

1. A memory system comprising:
   a memory device including a plurality of memory blocks;
   a bad memory block detection unit suitable for checking a memory block for performing a test read operation among the plurality of memory blocks through a test read table, and detecting a bad memory block by performing the test read operation on the checked memory block before performing a read request provided from a host; and
   a controller suitable for controlling the memory device to perform a read reclaim operation to the bad memory block according to a result of detecting the bad memory block by the bad memory block detection unit.

2. The memory system of claim 1, wherein the bad memory block detection unit includes:
   a test read management unit suitable for generating and updating the test read table for the plurality of memory blocks; and
   a test read operation unit suitable for controlling the memory device to perform the test read operation according to the test read table.

3. The memory system of claim 2, wherein the test read table has information about whether the read operation is performed to the plurality of memory blocks for a predetermined time.

4. The memory system of claim 3, wherein the test read table has flags of a high logic for memory blocks, to which the read operation is performed for the predetermined time, and flags of a low logic for memory blocks, to which the read operation is not performed for the predetermined time.

5. The memory system of claim 4, wherein the test read operation unit controls the memory device to perform the test read operation to a random block among the memory blocks corresponding to the flag of the high logic.

6. The memory system of claim 3,
   wherein the test read table has information about memory blocks, to which the read operation is performed for the predetermined time, and
   wherein the information of memory blocks includes addresses of the memory blocks.

7. The memory system of claim 6, wherein the test read operation unit controls the memory device to perform the test read operation to a random block among the memory blocks corresponding to the information of the test read table.

8. The memory system of claim 3, wherein the test read table has information about super memory blocks each including memory blocks to which the read operation is performed in the memory device for a predetermined time.

9. The memory system of claim 8,
   wherein the respective super memory blocks share a memory block with each other, and
   wherein the test read operation unit controls the memory device to perform the test read operation to the plurality of memory blocks included in each of the super memory blocks.

10. The memory system of claim 9, wherein the test read operation unit controls the memory device to perform the test read operation to a random block among the memory blocks included in the super memory blocks corresponding to the information of the test read table.

11. An operating method for a memory system, the operating method comprising:
    a bad memory block detection step of checking a memory block for performing a test read operation among the plurality of memory blocks through a test read table, and detecting a bad memory block by performing the test read operation on the checked memory block before performing a read request provided from a host; and
    a read reclaim step of performing a read reclaim operation to the bad memory block according to a result of the bad memory block detection step.

12. The operating method of claim 11, wherein the bad memory block detection step includes:
    generating and updating the test read table for the plurality of memory blocks; and
    performing the test read operation according to the test read table.

13. The operating method of claim 12, wherein the test read table has information about whether the read operation is performed to the plurality of memory blocks for a predetermined time.

14. The operating method of claim 13, wherein the test read table has flags of a high logic for memory blocks, to which the read operation is performed for the predetermined time, and flags of a low logic for memory blocks, to which the read operation is not performed for the predetermined time.

15. The operating method of claim 14, wherein the performing of the test read operation includes performing the test read operation to a random block among the memory blocks corresponding to the flag of the high logic.

16. The operating method of claim 13,
    wherein the test read table has information about memory blocks, to which the read operation is performed for the predetermined time, and
    wherein the information of memory blocks includes addresses of the memory blocks.

17. The operating method of claim 16, wherein the performing of the test read operation includes performing the test read operation to a random block among the memory blocks corresponding to the information of the test read table.

18. The operating method of claim 13, wherein the test read table has information about super memory blocks each including memory blocks to which the read operation is performed in the memory device for a predetermined time.

19. The operating method of claim 18,
    wherein the respective super memory blocks share the memory block with each other, and wherein the performing of the test read operation includes performing the test read operation to the plurality of memory blocks included in each of the super memory blocks.

20. The operating method of claim 19, wherein the performing of the test read operation includes performing the test read operation to a random block among the memory blocks included in the super memory blocks corresponding to the information of the test read table.

* * * * *